United States Patent [19]

Shoemaker

[11] 4,455,613

[45] Jun. 19, 1984

[54] TECHNIQUE OF RECONSTRUCTING AND DISPLAYING AN ANALOG WAVEFORM FROM A SMALL NUMBER OF MAGNITUDE SAMPLES

[75] Inventor: William E. Shoemaker, Santa Clara, Calif.

[73] Assignee: Gould Inc., Rolling Meadows, Ill.

[21] Appl. No.: 324,732

[22] Filed: Nov. 25, 1981

[51] Int. Cl.³ ............................................. G01R 23/16
[52] U.S. Cl. ................................. 364/487; 324/77 R
[58] Field of Search ..................... 364/487; 324/77 R; 328/114, 151

[56] References Cited

U.S. PATENT DOCUMENTS

| | | | |
|---|---|---|---|
| 3,758,763 | 9/1973 | Nohara et al. | 364/487 |
| 4,072,851 | 2/1978 | Rose | 364/487 |
| 4,142,146 | 2/1979 | Schumann et al. | 364/487 X |
| 4,192,003 | 3/1980 | Brock et al. | 364/487 |

Primary Examiner—Edward J. Wise
Attorney, Agent, or Firm—K. H. Pierce; Edward E. Sachs

[57] ABSTRACT

A technique utilizing either particular software with a microprocessor or computer or a hard wired digital or analog circuit for determining, from a few sample magnitudes acquired from an analog signal at equal time intervals, the shape of the waveform and displaying it. The analog waveform slope at each sample is calculated from the magnitude of the two samples taken from the waveform immediately preceding a given sample and the two immediately following the given sample. A slope of the analog waveform intermediate of each sample interval is then calculated from this information, leading to a final calculation of the magnitude of a selected number of points during the sample interval. The acquired sample magnitudes and the calculated intermediate magnitudes are then combined in a display of a reconstruction of the original analog waveform.

8 Claims, 7 Drawing Figures

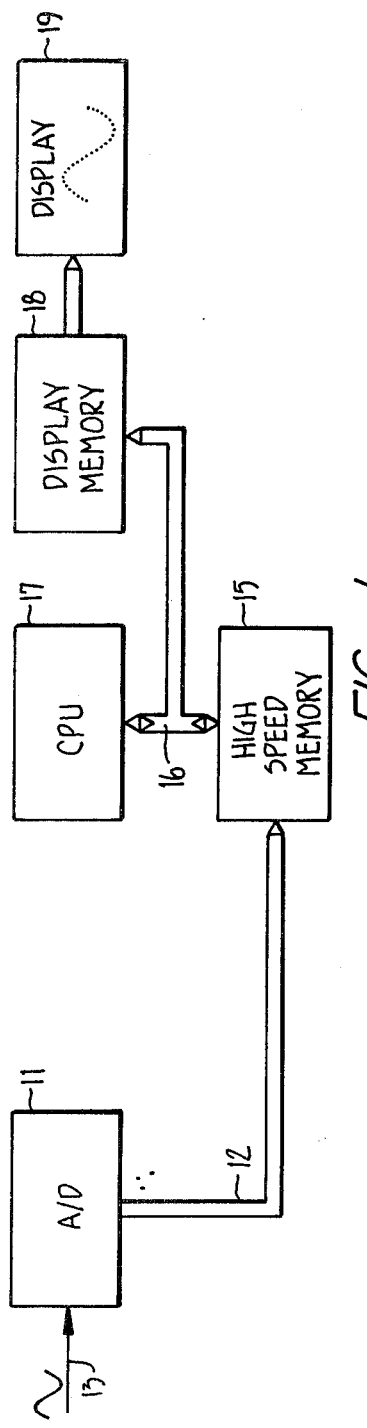
FIG._1.
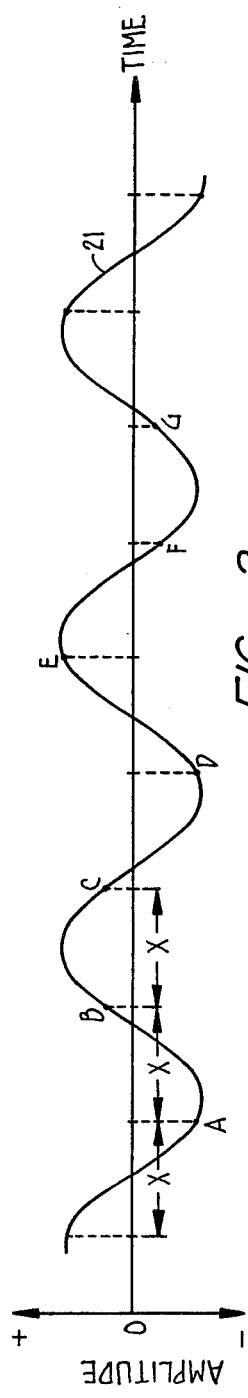
FIG._2.
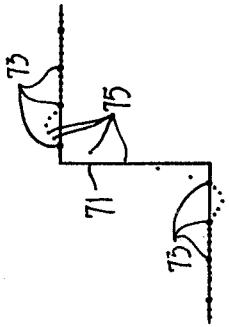
FIG._7.

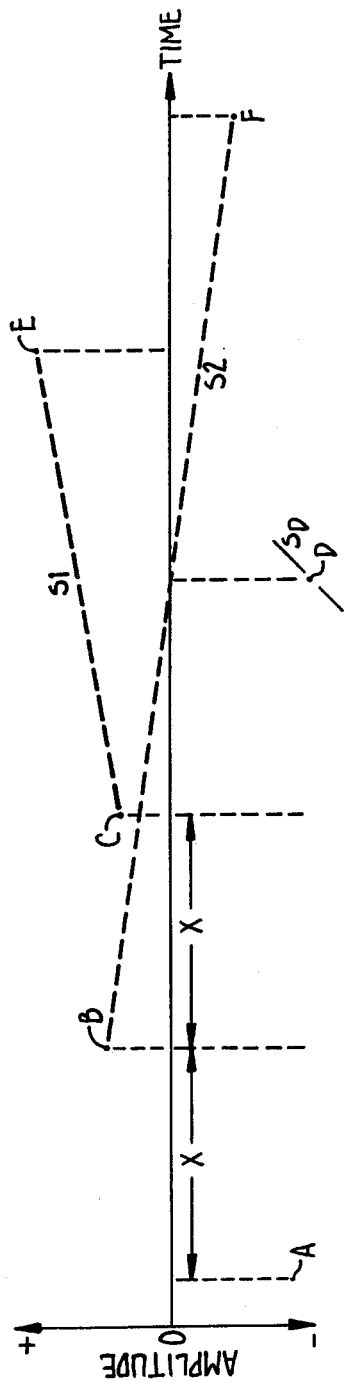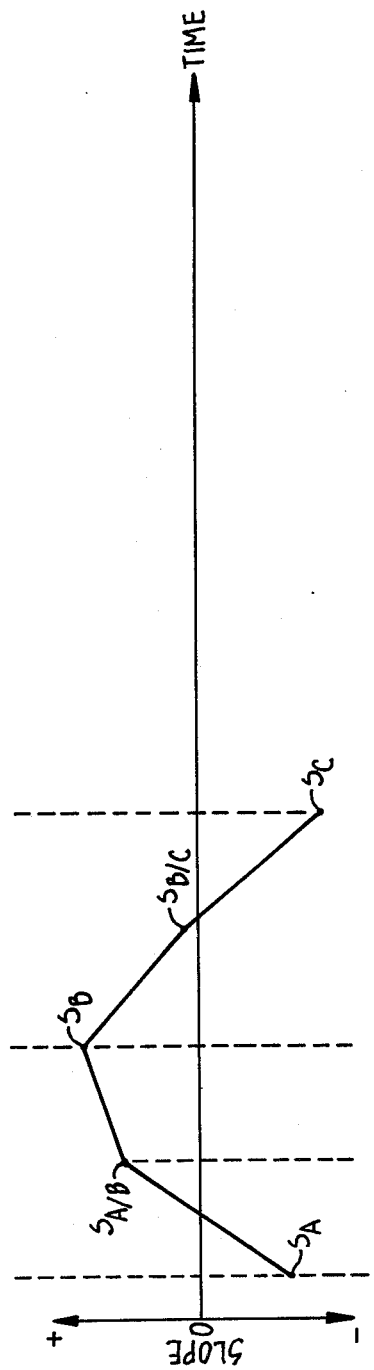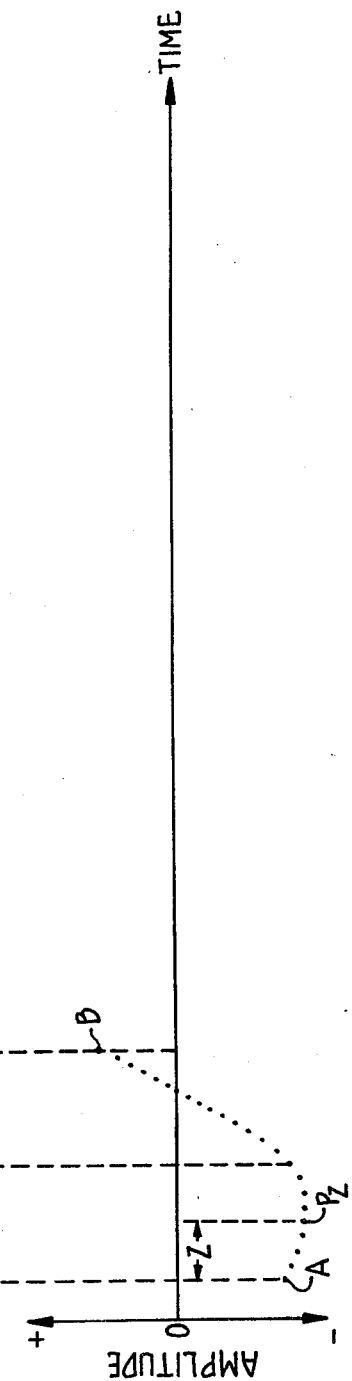

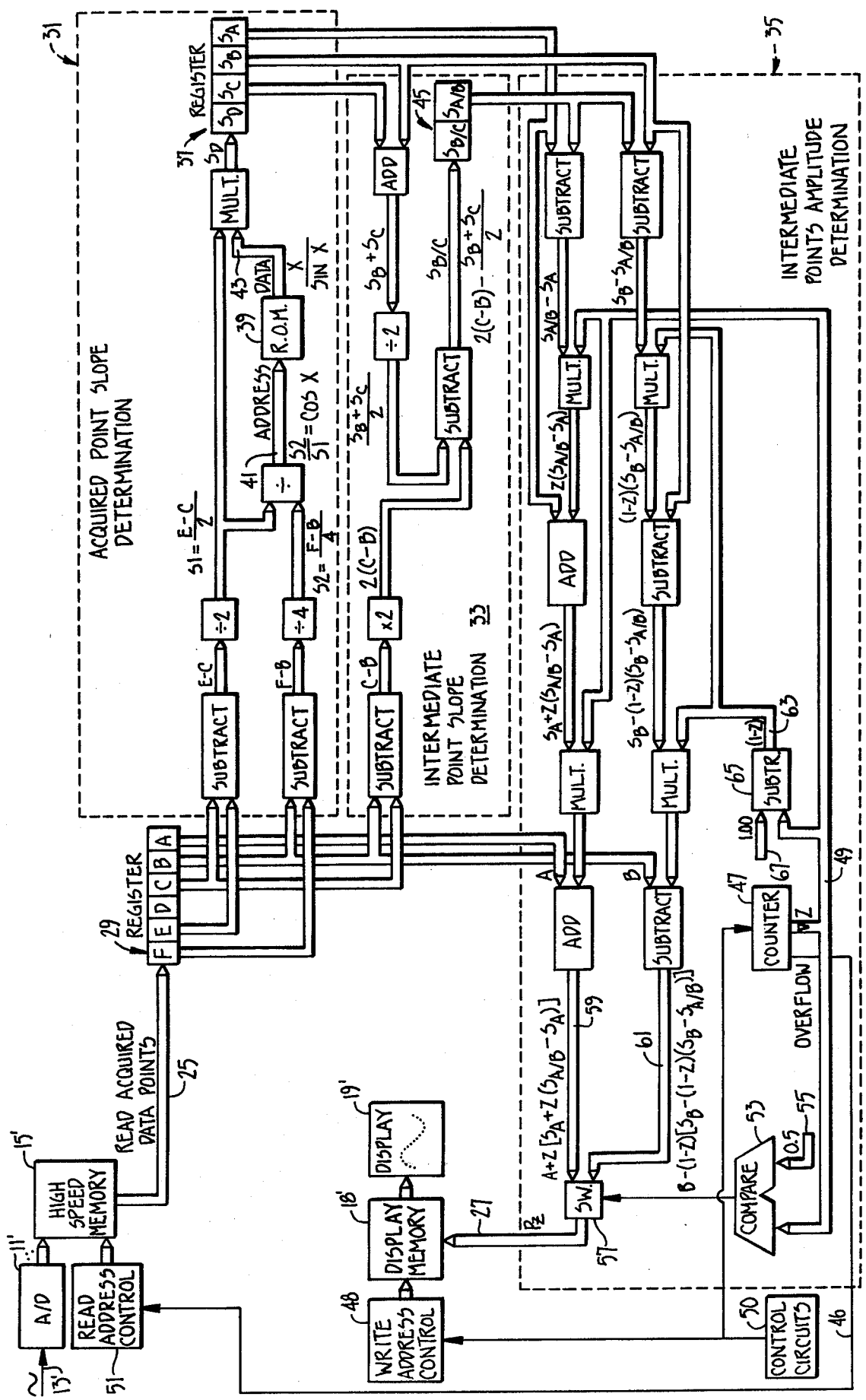
FIG._6.

TECHNIQUE OF RECONSTRUCTING AND DISPLAYING AN ANALOG WAVEFORM FROM A SMALL NUMBER OF MAGNITUDE SAMPLES

BACKGROUND OF THE INVENTION

This invention relates generally to the art of recording and displaying electrical waveforms, and more specifically, to the art of reconstructing and displaying a waveform from a minimum number of sample data points of an actual analog waveform.

There are a number of types of instruments that digitize and store samples of an analog waveform and display on a CRT or other graphic display device a reconstruction of the analog signal that produced those samples. Instruments that use this technique include transient analyzers, waveform recorders and digital oscilloscopes. There are often very few samples taken per cycle of the waveform being analyzed, either because the frequency of the waveform approaches one-half the maximum sampling rate of the instrument or because the user selects a low sampling rate which enables the limited memory of the instrument to store samples over a longer time interval. Pursuant to the well known Nyquist theorem, at least two samples must be taken for each cycle of the analog waveform in order to permit its reconstruction.

If there are only a few samples per cycle of the waveform, the display of those samples alone will not give enough information for the viewer to adequately visualize the original analog waveform. One common aid to visualization is to connect the dots with straight lines but this can give an inaccurate representation of the original waveform if there are few samples per cycle, which is often the case.

A more sophisticated approach to reconstructing a replica of the original waveform is to perform a filtering or Fourier operation on a string of samples taken of the magnitude of the original waveform. This provides a much better visualization of the analog signal and can be implemented in either dedicated hardware, such as a digital-to-analog converter followed by a transversal filter, or in software if the instrument is microprocessor or computer based. However, the hardware approach is expensive and the software approach has a disadvantage of requiring a large number of high precision multiply and divide operations which takes a considerable amount of time.

Another software approach has also been used when there are a significant number of samples per cycle in excess of the minimum two samples. The slopes of the waveform at each sampled point are first roughly estimated using only the data points immediately on either side of each point, and then one of a number of stored display segments having the closest match of its end point slopes is selected from a number of such stored display segments, which may be 50 or more in number. This technique has a disadvantage of having lesser accuracy than other techniques when few samples per cycle exist.

Therefore, it is a principal object of the present invention to provide a technique and system for accurately, rapidly and inexpensively reconstructing analog waveforms from a series of magnitude samples of an actual analog waveform.

SUMMARY OF THE INVENTION

This and additional objects are accomplished by the various aspects of the present invention, wherein, briefly, three separate calculating steps are performed in either software or hardware. The first step is to determine from the samples the slope of the waveform at each sample location. This is accomplished in a specific form of the invention by utilizing the two samples immediately preceding the sample location wherein the slope is to be determined and the two samples immediately following it. This is done for each of the samples of a series of samples acquired from an analog waveform, except that the slope at the first two samples and the last two samples of the series cannot be determined. The slope values determined are of direct usefulness in that it is often desired to determine the slope of a waveform at one or more given locations, and this is an easy and rapid technique for doing so. Further, the frequency of the analog waveform at a particular sample location can also easily be ascertained from the two immediately preceding and immediately following sample magnitudes.

In order to provide information to reconstruct and display a waveform that aids the user in visualizing the original analog waveform, some technique of providing more information of the waveform between the sample points is required. If there are enough sample points, the aforementioned technique of matching one of a large number of stored segments with the slopes at adjacent sample points may be employed. But, according to the present invention, it is preferable to determine with second and third steps a better estimate of the waveform between sample points for the purposes of display. The second step is to utilize the sample magnitudes and calculated slopes at the sample points to determine the slope of the waveform at an intermediate point of each sample interval. This is accomplished by assuming that the slope of the waveform changes linearly from one sample point to the mid-point of the sampling interval and then linearly again from that mid-point to the opposite sample point. The third step is to determine as many points in the sample interval as is desired for display along with the acquired sample magnitudes, these intermediate points being determined from the acquired sample magnitudes, the calculated slopes at the sample points and the calculated intermediate points. A primary advantage of this technique is that the various calculations can be performed in softwave very rapidly.

Additional objects, advantages and features of the various aspects of the present invention will become apparent in the following description of its preferred embodiment, which description should be taken in conjunction with the accompanying drawings:

BRIEF DESCRIPTION OF THE DRAWINGS

FIG. 1 illustrates a standard digital display system using a microprocessor;

FIG. 2 illustrates an example of an analog waveform that is processed by the system of FIG. 1;

FIGS. 3, 4 and 5 illustrate the various FIG. 2 waveform characteristics that are utilized in reconstructing and displaying a replica thereof;

FIG. 6 shows a digital hard wired system for alternatively carrying out the techniques of the present invention described with respect to FIGS. 3-5; and FIG. 7 illustrates another result of the present invention.

DESCRIPTION OF THE PREFERRED EMBODIMENTS

Referring to FIG. 1, an example of an existing digital displayed instrument is generally shown. An analog-to-digital converter 11 receives at an input 13 an analog waveform to be analyzed. The converter 11 takes a series of samples of the magnitude of the incoming analog waveform, generally at equal time intervals. These values are usually loaded directly into a high speed memory 15 since they are being acquired so fast that processing cannot be done in real time. Once the string of such samples is acquired, a microprocessor 17 uses the stored samples to reconstruct on a display 19 a representation of the original waveform at the input 13. The display device 19 is most usually a CRT display but can alternatively be an x-y plotter. Values of the waveform displayed are stored in a display memory 18. Specific techniques for determining the displayed waveform from a string of samples include those discussed above. The improved techniques of the present invention can be implemented in the same type of system by unique controlling software.

Referring to FIG. 2, a sinusoidal analog waveform 21 is assumed, for the purposes of explaining the techniques of the present invention, to be the input waveform at circuit 13 of the FIG. 1 instrument. The analog-to-digital converter 11 samples the waveform at equal intervals "x". A plurality of successively acquired samples are marked with the letters "A" through "G" for purposes of identifying the individual samples. These letters are also used hereinafter as an indication of the magnitude of the samples taken at those particular locations, which is also, of course, the magnitude of the waveform 21 at those locations.

In this example, there are only approximately three samples taken per cycle of the waveform 21. With these few sample points, a display of them directly would not give the viewer much of an indication of the waveform itself, nor would drawing lines between them be very helpful to this visualization. Therefore, additional information is determined about the waveform before a display of the acquired sample information is attempted. This additional information is determined solely from the samples taken.

A first step in this process is illustrated in FIG. 3 wherein sample magnitudes A through F are plotted in an expanded scale. The first step is to determine from those sample magnitudes the slope of the waveform 21 at each of the sample points. FIG. 3 illustrates the method of determining the slope $S_D$ at the sample point D. A line labeled "S1" is drawn between sample points C and E, those immediately on either side of the sample D of interest. Similarly, another line with slope "S2" is drawn between samples B and F, the samples on either side of the given sample point D but one sample removed therefrom. From observation of FIG. 3, these slopes can be expressed as:

$$S1 = \frac{E - C}{2} \quad (1)$$

$$S2 = \frac{F - B}{4} \quad (2)$$

where B, C, E and F refer to the magnitude of the signal samples taken at those locations. It can further be shown that:

$$\frac{S2}{S1} = \cos x, \text{ and} \quad (3)$$

$$S_D = S1\left(\frac{x}{\sin x}\right) \quad (4)$$

where $S_D$ is the desired slope quantity to be determined. Combining equations (3) and (4), we have:

$$S_D = S1\left(\frac{\cos^{-1}\left(\frac{S2}{S1}\right)}{\sin\left[\cos^{-1}\left(\frac{S2}{S1}\right)\right]}\right) \quad (5)$$

A software implementation of the waveform display technique of the present invention requires of the first step the solution of equation (5) for each acquired sample data point, except of course the first two and last two samples of a string of data which cannot be determined by this technique. Since the normal string of data will include in the range of 1000 individual samples, the inability to calculate the slopes of the first two and last two of those samples causes no difficulty in obtaining an accurate reconstructed display of the original waveform 21. The trigometic functions of the equation (5) are most conveniently solved in software by using a look-up table, one given in Appendix I hereto. Once the ratio of the slopes S2/S1 is determined from equations (1) and (2), this value is used as a table index and is found in the left hand column marked by its equivalent "cos (x)". The opposite number in the second column is the stored value of the large parenthetical quantity of equation (5). When this table value is multiplied by the slope S1, the product is the desired slope at the point D. Similar calculations are made for each of the other sample points.

It should be noted at this point that although the calculated waveform slopes at the sample point are intermediate quantities used to reconstruct the entire analog waveform for display, it is often desired merely to determine the slope at one or more points of a waveform as the end result. The technique described so far with respect to FIG. 3, therefore, has that useful end result which can be appropriately displayed at 19 in the system of FIG. 1.

Further it is often desired to determine the frequency of the waveform at a particular sample location or locations without reconstructing the entire waveform. This can be done by a technique of calculating the slopes S1 and S2, taking their ratio and then determining the arc cosine of the ratio in order to determine the interval x in radians, according to equation (3). That is, the interval x as a fraction of the wavelength of the analog waveform 21 is determined. Since the actual sampling interval time of the analog-to-digital converter will also be known the frequency "f" of the analog waveform 21 is given by:

$$f = \frac{x}{2\pi y} \quad (6)$$

where "y" is the actual sampling interval time of the converter 11.

It will be noted from the table of Appendix I hereto that the range of values of S2/S1 provided in the left hand column is from a positive 1.00 to a negative 0.98. Values outside of the range of positive 1.00 to negative 1.00 can occur due to aliasing (analog frequencies greater than one-half the sampling rate), noise, or digitizing error. Values of S2/S1 greater than 1.0 are reduced to 1.0 and thus the table is used. Similarly, values less than −0.98 are changed to −0.98 and the table of Appendix I utilized. It has been found that this provides a satisfactory determination. If the original analog signal waveform 21 is sinusoidal and there are at least 2.14 samples per cycle, the technique described with respect to FIG. 3 for determining the waveform slopes at the sample point location is precise. The factor of 2.14 comes from the selection of −0.98 as the most negative S2/S1 ratio of the table of Appendix I into which all of the values obtained are fit. The −0.98 is selected somewhat arbitrarily as a limit since something more positive than −1 must be used, for a value S2/S1 of −1 causes the x/sin (x) quantity opposite it in the table of Appendix I to be infinite.

In order to determine the locus of points between the sample points for reconstructing from the samples an accurate representation of the original waveform 21, second and third calculation steps are performed. Referring to FIG. 4, the waveform slope values $S_A$, $S_B$, and $S_C$ previously calculated according to the first step described above with respect to FIG. 3, are plotted. It is assumed for the purpose of this explanation that the calculation of the slope $S_D$, according to the first step previously described in detail, has not yet been completed. But since the second and third steps of calculation require the use of these determined slope values, a further calculation is performed for the region of the waveform wherein these slopes have been fully calculated. In this example, therefore, the first, second and third steps of calculation are all occurring simultaneously, the portion of the waveform being operated upon by the second calculation step trailing that of the first, and the portion operated upon by the third step trailing that of the second step. Of course, it may not be possible or desirable for such simultaneous calculations to be made in certain hardware and software configurations, so the steps may alternatively be performed in sequence on a given sample interval until the locus of points in that interval have been completely calculated, and then the process repeated one step at a time for the next sample interval, and so on. Whether the calculating steps are done simultaneously for different sample intervals or one at a time on a given sample interval, the various steps described herein are eventually performed on each sample interval of a string of acquired sample points, except for the first two and last two intervals of that string, as previously discussed.

Referring to FIG. 4, the second calculation step for each sample interval will now be described, the interval between samples B and C being taken as an example. One of the simplest equations of the locus of points in the sample interval occurs if it is assumed that the slope of the waveform 21 changes linearly from $S_B$ at sample B, to the slope of $S_{B/C}$ at the midpoint of the sampling interval, and also changes linearly from $S_{B/C}$ to the slope $S_C$ previously calculated to exist at the sample location C. It has been found that this assumption greatly simplifies and speeds up the calculation of the desired points for reconstructing the waveform, and that such reconstruction is very accurate for sinusoidal waveforms, and better than existing techniques for non-sinusoidal waveforms. What is desired is to describe the slope of the interval with the information available, mainly the magnitude of the waveform at the beginning and end of the interval, and the calculated values of slopes at those positions. If slope is expressed in terms of units per sample interval x, the average slope in the interval is given by the difference between the magnitudes of the samples at the beginning and end of the interval B-C in this example. The mid-point slope value $S_{B/C}$ is set so that this average slope is the result of a slope function that extends between and includes $S_B$ and $S_C$. Such a condition can be expressed as follows:

$$C - B = \tfrac{1}{2}\left(\frac{S_B + S_C}{2} + S_{B/C}\right) \tag{7}$$

Solving equation (7) for the mid-point slope $S_{B/C}$ $$S_{B/C} = 2(C - B) - \frac{S_B + S_C}{2} \tag{8}$$

The third step which results in calculating the magnitudes of a locus of points in a sample interval is explained with respect to FIG. 5 wherein the interval between samples A and B is taken as an example. The magnitude of each calculated point within the sample interval is identified as $P_Z$ where z is the distance of the point from the first sample of the interval, in this case the sample A. The location z of each calculated point is most conveniently expressed as a decimal where the entire interval is assigned a value of 1.00. With these definitions, the magnitudes of the intermediate points can be calculated from the interval end-point calculated slopes $S_A$ and $S_B$ and the intermediate calculated slope $S_{A/B}$, as follows:

$$P_z = A + Z[S_A + Z(S_{A/B} - S_A)] \tag{9}$$

for $0 \leq z \leq 0.5$, and $$P_z = B - (1-Z)[S_B - (1-Z)(S_B - S_{A/B})] \tag{10}$$

for $0.5 \leq Z \leq 1.0$

Enough individual values $P_z$ are calculated so that the resulting display is a smooth one, either by showing only the dots resulting from the calculations or by displaying them with lines drawn between them. Since speed of calculation is also a goal, however, the number of points to be calculated needs to be limited to that necessary for an adequate display under the circumstances. More points are necessary when the display is to be expanded or detail of a portion of the analog signal is required. Equations (9) and (10) are easily solved by standard software techniques. These resulting intermediate calculated points are then stored in the display memory 18 of FIG. 1 along with the values of the acquired samples A, B, C and so forth. It is the combination of these actual samples and intermediate calculated values $P_z$ that are combined to form a reconstruction on the display 19 of the original analog signal 21.

A computer program for carrying out the processes described above is given in Appendix II hereto. The program is in Intel PL/M code and designed to run on an Intel 8086 microprocessor within the CPU 17 of FIG. 1.

Although the use of software techniques with a microprocessor or computer to solve the above equations is a preferred technique, the various aspects of the present invention may also be implemented by a digital or analog hardware system. Such a digital system is shown in FIG. 6. The circuits there shown are also directed to making the determination of the example of FIGS. 3-5. The required samples from an analog-to-digital converter 11' are stored in a high speed digital memory 15'. These acquired data points are later read out of memory 15' through a bus 25 for use in forming the reconstructed display. Intermediate points $P_z$ and original samples to be displayed are stored in a display memory 18' through a digital bus 27 as a result of the acquired data points in the bus 25 being processed by the bulk of the circuitry of FIG. 6 which will now be described.

The acquired data points A, B, C, etc., are loaded into a serial register 29. This could be done directly from the output of the analog-to-digital converter 11' except that the speed of FIG. 6 circuitry may not be fast enough to carry out the calculations in real time if the samples are being acquired from the waveform 21 at a very high rate of speed. Thus, the memory 15' serves as a buffer. The register 29 is shown to contain in each of its stages a digital value corresponding to each of the samples A through F. What is shown in FIG. 6 is a "snap shot" of the processing of these data points.

The processing the signal sample is accomplished by circuits 31, 33 and 35 which in effect carry out the first, second and third calculating steps, respectively, that have previously been described with respect to FIGS. 3, 4 and 5, respectively. Circuit 31 is made of standard digital elements performing the function indicated on the drawing and calculating the individual slopes of the waveform at the sample locations. Digital words identifying the magnitudes of these slopes are temporarily stored in a serial register 37 for use in subsequent processing steps by the circuits 33 and 35. The slope values may also be removed into the memory 18', if desired, for displaying or indicating the slope values themselves which are often desired to be known. A read-only-memory 39 contains the table of Appendix I, wherein a digital word corresponding to the magnitude of the S2/S1 ratio is applied through an address line 41 and the resulting data stored for that address being the X/sin (x) quantity in the second column of the table of Appendix I, which is given in the data output line 43. The processing of the circuit 31 carries out the previously described calculation of equations (1) through (5).

The circuits 33 receive the slope values from the register 37 and the sample magnitudes from the register 29 to calculate intermediate slopes which are temporarily stored in a register 45. The circuit 33 makes a determination in accordance with equation (8) previously described.

Circuits 35 receive digital words corresponding to slope values from registers 37 and 45 as well as digital words corresponding to the magnitude of samples which are temporarily stored in the register 29. The circuits 35 carry out the determinations of the intermediate reconstructed waveform point $P_z$ as previously described with respect to equations (9) and (10). For a given set of input words to the circuits 35, a number of point values are determined in the output bus 27 for different values of z across a particular interval, the interval between samples A and B being used for an example. A digital counter 47 changes by fractional increments from 0 to 1 in a bus 49 which is the "z" shown on FIG. 5 and used in equations (9) and (10). If the count exceeds 1, an overflow occurs in a line 46 and the total count is reduced by 1 to begin the cycle over. The overflow line 46 is connected to a memory address control circuit 51 that causes the addressed read position in the high speed memory 15' to increment to the next location upon overflow. The interval between successive values of z generated by the counter 47 is set to provide in the output bus 27 the desired number of calculated intermediate reconstructed waveform points. The counter 47 is incremented under the control of circuits 50 which also, synchronously controls through circuits 48 the address location of the display memory 18'.

A digital comparator 53 receives the bus 49 at one input and a fixed digital value of 0.5 from another input 55. The comparator 53 has its output connected to a multiplexer 57, which alternately switches between the value of $P_z$ in a bus 59 when the value of z in the bus 49 is equal to or less than 0.5, and the value of $P_z$ in a bus 61 when the value of z is greater than 0.5. Further, since the quantity $(1-z)$ is required in determining the $P_z$ of the bus 61, a digital word corresponding to this quantity is generated from the bus 49 in a bus 63, as a result of a digital subtraction circuit 65 which subtracts the value in the bus 49 from a constant 1.00 of the input 67.

The circuit of FIG. 6 has been shown and described at one instant of time wherein the registers 29, 37 and 45 contain particular acquired and calculated values which are maintained while the counter 47 changes in fractional increments from 0 to 1 in order to determine a number of desired points intermediate of a particular sample interval of the waveform 21 (FIG. 2). Once the counter 47 has overflowed, the digital words contained in the various stages of the serial registers 29, 37 and 45 are incremented one stage to the right away from their inputs. This then provides to the circuit 35 the next in order acquired sample magnitude and calculated slopes which permits the determination of a number of intermediate points for that new sample interval.

The circuit of FIG. 6 is configured so that each of its portions 31, 33 and 35 can operate simultaneously in determining quantities in connection with three sample intervals. Of course, the circuits 31, 33 and 35 can be connected slightly differently in order for all of them to operate on the same sample interval before proceeding to the next bus this processing would be slower since the new quantity to be calculated and stored in the register 37 must be performed before the circuit 33 can begin its calculations, and similarly the results of the circuits 33 must be stored in its output register 45 before the circuits of 35 can begin their processing.

The specific example utilized in describing the various aspects of the invention with respect to FIGS. 1-6 use a sinusoidal waveform 21 as its example. But the techniques and circuits described work equally well on non-sinusoidal waveforms, such as a step function illustrated in FIG. 7. A step analog signal 71 as part of the signal in circuit 13 or 13' of FIGS. 1 and 6, respectively, is assumed. The acquired data points 73 are shown on the display 19 or 19' along with the calculated points 75 in the pattern indicated in FIG. 7. The displayed points more faithfully reproduce the input analog signal 71 than do previously described existing techniques when the extreme step function 71 is part of the analog signal that is being sampled and processed. The most popular of the present other techniques that are employed reproduce the signal with a substantial amount of overshoot and ringing. With the techniques of the present invention overshoot is minimal and ringing does not occur.

Although the various aspects of the present invention have been described with respect to specific examples thereof, it will be understood that the invention is entitled to protection within the full scope of the appended claims.

APPENDIX I

| INDEX $\frac{S2}{S1} = \cos(X)$ | STORED VALUE $X/\sin(X)$ | INDEX $\frac{S2}{S1} = \cos(X)$ | STORED VALUE $X/\sin(X)$ |
|---|---|---|---|
| 1.00 | 1.0000 | 0.00 | 1.5708 |
| 0.98 | 1.0067 | −0.02 | 1.5911 |
| 0.96 | 1.0136 | −0.04 | 1.6122 |
| 0.94 | 1.0205 | −0.06 | 1.6338 |
| 0.92 | 1.0276 | −0.08 | 1.6563 |
| 0.90 | 1.0347 | −0.10 | 1.6794 |
| 0.88 | 1.0420 | −0.12 | 1.7034 |
| 0.86 | 1.0494 | 0.14 | 1.7283 |
| 0.84 | 1.0570 | −0.16 | 1.7541 |
| 0.82 | 1.0647 | −0.18 | 1.7810 |
| 0.80 | 1.0725 | −0.20 | 1.8088 |
| 0.78 | 1.0805 | −0.22 | 1.8377 |
| 0.76 | 1.0886 | −0.24 | 1.8670 |
| 0.74 | 1.0968 | −0.26 | 1.8992 |
| 0.72 | 1.1052 | −0.28 | 1.9320 |
| 0.70 | 1.1138 | −0.30 | 1.9662 |
| 0.68 | 1.1225 | −0.32 | 2.0019 |
| 0.66 | 1.1314 | −0.34 | 2.0393 |
| 0.64 | 1.1405 | −0.36 | 2.0705 |
| 0.62 | 1.1497 | −0.38 | 2.1197 |

APPENDIX I-continued

| INDEX $\frac{S2}{S1} = \cos(X)$ | STORED VALUE $X/\sin(X)$ | INDEX $\frac{S2}{S1} = \cos(X)$ | STORED VALUE $X/\sin(X)$ |
|---|---|---|---|
| 0.60 | 1.1591 | −0.40 | 2.1631 |
| 0.58 | 1.1687 | −0.42 | 2.2086 |
| 0.56 | 1.1785 | −0.44 | 2.2566 |
| 0.54 | 1.1886 | −0.46 | 2.3076 |
| 0.52 | 1.1988 | −0.48 | 2.3615 |
| 0.50 | 1.2092 | −0.50 | 2.4184 |
| 0.48 | 1.2199 | −0.52 | 2.4794 |
| 0.46 | 1.2308 | −0.54 | 2.5443 |
| 0.44 | 1.2419 | −0.56 | 2.6135 |
| 0.42 | 1.2533 | −0.58 | 2.6881 |
| 0.40 | 1.2649 | −0.60 | 2.7680 |
| 0.38 | 1.2768 | −0.62 | 2.8547 |
| 0.36 | 1.2890 | −0.64 | 2.9485 |
| 0.34 | 1.3014 | −0.66 | 3.0508 |
| 0.32 | 1.3142 | −0.68 | 3.1625 |
| 0.30 | 1.3273 | −0.70 | 3.2860 |
| 0.28 | 1.3406 | −0.72 | 3.4219 |
| 0.26 | 1.3544 | −0.74 | 3.5746 |
| 0.24 | 1.3684 | −0.76 | 3.7461 |
| 0.22 | 1.3829 | −0.78 | 3.9407 |
| 0.20 | 1.3977 | −0.80 | 4.1641 |
| 0.18 | 1.4129 | −0.82 | 4.4246 |
| 0.16 | 1.4285 | −0.84 | 4.7339 |
| 0.14 | 1.4446 | −0.86 | 5.1089 |
| 0.12 | 1.4611 | −0.88 | 5.5748 |
| 0.10 | 1.4781 | −0.90 | 6.1746 |
| 0.08 | 1.4956 | −0.92 | 6.9897 |
| 0.06 | 1.5135 | −0.94 | 8.1893 |
| 0.04 | 1.5321 | −0.96 | 10.2178 |
| 0.02 | 1.5511 | −0.98 | 14.8240 |

APPENDIX II

PL/M-86 COMPILER    4500 SINE INTERPOLATION PROCEDURES    28 OCT 81    PAGE 1
ISIS-II PL/M-86 V2.1 COMPILATION OF MODULE SINE_V003
OBJECT MODULE PLACED IN :F1:SINE.OBJ
COMPILER INVOKED BY: PLM86 :F1:SINE.003 DATE (28 OCT 81)

```
            $TITLE('4500 SINE INTERPOLATION PROCEDURES') OPTIMIZE(3) DEBUG
1           SINE_V003: DO;
            /* ************************************************************ */
            /* 4500 SINE INTERPOLATION DISPLAY PROCEDURES                   */
            /* PROGRAMMER: D. MCBRIDE MODIFIED BY J. GOODSELL               */
            /* LAST MODIFIED: 28 OCT 81                                     */
            /* HISTORY:                                                     */
            /* V001: REWROTE TO INCORPORATE ENVELOPE ALGORITHM, 10/10/81    */
            /* V002: 10/13/81 MODIFIED TO DO ENTIRE TRACE, FROM LEFT TO     */
            /* RIGHT OF SCREEN, TO EXTRAPOLATE WHEN AT EXTREMES OF          */
            /* SAMPLE DOMAIN, AND TO USE 24-BIT COUNTERS.                   */
            /* V003: 10/19/81 MODIFIED TO OUTPUT TO A CURSOR BUFFER, NOT    */
            /* TO SCREEN.                                                   */
            /* ************************************************************ */
            $INCLUDE (:F1:TMAP.INC)
          =
          = /* INCLUDE FILE TMAP.INC. MODIFIED 28 OCT 81 */
          =
2  1      = DECLARE TMAP_STRUC LITERALLY
          = 'STRUCTURE (XL WORD, XM WORD, XR WORD, IL WORD, IM WORD,
          = XINC1 WORD, IINC1 WORD, XINC2 WORD, IINC2 WORD,
          = ILIMIT WORD, MTB BYTE)';
          =
3  1        DECLARE DCL LITERALLY 'DECLARE',
            LIT LITERALLY 'LITERALLY';
4  1        INT$RATIO: PROCEDURE (I1, I2, I3) INTEGER EXTERNAL;
5  2        DCL (I1, I2, I3) INTEGER;
6  2        END INT$RATIO;
7  1        ICLIP: PROCEDURE (I, LB, UB) INTEGER EXTERNAL;
8  2        DCL (I, LB, UB) INTEGER;
9  2        END ICLIP;
10 1        SUSPEND$TASK: PROCEDURE EXTERNAL;
11 2        END SUSPEND$TASK;
12 1        EVAL: PROCEDURE (SOURCE_CODE, INDEX) INTEGER EXTERNAL;
13 2        DCL SOURCE_CODE BYTE,
            INDEX WORD;
14 2        END EVAL;
```

PL/M-86 COMPILER    4500 SINE INTERPOLATION PROCEDURES    28 OCT 81    PAGE 2
                    SLOPE COMPUTATION

```
            $SUBTITLE ('SLOPE COMPUTATION')
            /* THIS TABLE CONTAINS EVALUATED POINTS ON THE FOLLOWING FUNCTION:
```

APPENDIX II-continued $$\frac{ARCCOS(I)}{SIN(ARCCOS(I))} * \left(0.3 + \frac{2.8 * (1 - COS(ARCCOS(I)/2))}{ARCCOS(I) * SIN\ ARCCOS(I)/2)}\right)$$

! I (THE TABLE INDEX) IS SCALED SO LSB IS 1/128.
! VALUE GOTTEN FROM TABLE IS SCALED SO LSB IS 1/1024. */

```
15 1    DCL COSX_TBL (256) INTEGER DATA
        (1024, 1027, 1030, 1033, 1036, 1039, 1042, 1045, 1048, 1051, 1054, 1057,
        1060, 1063, 1067, 1070, 1073, 1076, 1079, 1083, 1086, 1089, 1093, 1096,
        1099, 1103, 1107, 1110, 1113, 1116, 1120, 1124, 1128, 1131, 1135, 1138,
        1142, 1146, 1150, 1153, 1157, 1161, 1165, 1169, 1173, 1177, 1181, 1185,
        1189, 1193, 1196, 1201, 1206, 1210, 1214, 1218, 1223, 1227, 1231, 1236,
        1240, 1245, 1249, 1254, 1259, 1263, 1268, 1273, 1277, 1282, 1287, 1292,
        1297, 1302, 1307, 1312, 1317, 1323, 1328, 1333, 1338, 1344, 1349, 1355,
        1360, 1366, 1371, 1377, 1383, 1389, 1385, 1400, 1406, 1412, 1418, 1425,
        1431, 1437, 1443, 1450, 1456, 1463, 1470, 1476, 1483, 1490, 1497, 1504,
        1511, 1518, 1525, 1532, 1540, 1547, 1555, 1562, 1570, 1578, 1586, 1594,
        1602, 1610, 1618, 1627, 1635, 1644, 1652, 1661, 1679, 1679, 1688, 1698,
        1707, 1716, 1726, 1736, 1746, 1756, 1766, 1776, 1787, 1797, 1808, 1819,
        1830, 1841, 1852, 1864, 1875, 1887, 1899, 1912, 1924, 1937, 1949, 1962,
        1965, 1989, 2003, 2016, 2030, 2045, 2059, 2074, 2089, 2105, 2120, 2136,
        2152, 2169, 2185, 2202, 2220, 2238, 2256, 2274, 2293, 2312, 2332, 2352,
        2372, 2393, 2414, 2436, 2458, 2480, 2504, 2527, 2552, 2576, 2602, 2628,
        2654, 2682, 2710, 2738, 2768, 2798, 2829, 2861, 2894, 2928, 2963, 2998,
        3035, 3073, 3112, 3153, 3194, 3237, 3282, 3328, 3375, 3435, 3476, 3529,
        3584, 3642, 3702, 3764, 3829, 3896, 3967, 4041, 4119, 4201, 4286, 4377,
        4472, 4572, 4679, 4792, 4912, 5040, 5177, 5324, 5482, 5653, 5838, 6040,
        6260, 6503, 6772, 7072, 7409, 7792, 8232, 9844, 9351,10086,10999,12177,
        13776,16125,20077,29021);
16 1    COMPUTE_SLOPE: PROCEDURE(P1, P2, P4, P5) INTEGER;
        /* GIVEN Y-COORDINATES OF FIRST 2 AND LAST 2 OF 5 EQUALLY-SPACED POINTS,
        !   THIS COMPUTES THE SLOPE AT THE 3-RD (MIDDLE) POINT. SLOPE IS IN
        !   Y-COORDINATE INPUT UNITS PER SAMPLE INTERVAL. */
17 2    DCL (P1, P2, P4, P5, COSX, TEMP, VAL) INTEGER;
18 2    DCL INDEX WORD;
19 2    IF (TEMP := (P4 - P2)) = 0
        THEN COSX = 1024;
21 2    ELSE COSX = INT$RATIO (512, P5 - P1, TEMP);
22 2    IF COSX > 1024 THEN COSX = 1024; ELSE IF COSX < -1015 THEN COSX = -1015;
```

PL/M-86 COMPILER    4500 SINE INTERPOLATION PROCEDURES        28 OCT 81    PAGE 2 & 3
2-ND ORDER EXTRAPOLATION ROUTINE

```
        INDEX = SHR(UNSIGN(1024 - COSX), 3);
27 2    VAL = COSX_TBL(INDEX) + INT$RATIO(INT(INDEX AND 0111B), COSX_TBL(INDEX + 1)
        - COSX_TBL(INDEX), 8);
28 2    RETURN INT$RATIO (TEMP, VAL, 2048);
29 2    END COMPUTE_SLOPE;
        $SUBTITLE ('2-ND ORDER EXTRAPOLATION ROUTINE')
        /* THIS ROUTINE ACCEPTS 3 POINT VALUES, P1, P2, AND P3, AND COMPUTES
        !   A 4-TH, USING 2-ND ORDER EXTRAPOLATION. */
30 1    XTRPLT: PROCEDURE (P1, P2, P3) INTEGER;
31 2    DCL (P1, P2, P3) INTEGER;
32 2    RETURN P3 + INT$RATIO(P3 - P2, P3, - P2, P2 - P1);
33 2    END XTRPLT;
```

PL/M-86 COMPILER    4500 SINE INTERPOLATION PROCEDURES        28 OCT 81    PAGE 4
SINE INTERPOLATED TRACE GENERATING ROUTINE

```
        $SUBTITLE ('SINE INTERPOLATED TRACE GENERATING ROUTINE')
        /* DEFINE PARAMETERS. THESE ARE SET UP FROM THE CALLING PARAMETERS
        !   SO THE SUBROUTINE DRAW_LINEAR_REGION CAN ADDRESS THEM WITHOUT
        !   HAVING TO HAVE THEM PASSED IN EXPLICITLY. */
34 1    DCL T BYTE, /* CODE FOR TRACE 1 OR TRACE 2 */
        TRACE_BUFFER_BASE POINTER,
        (TRACE BUFFER BASED TRACE_BUFFER_BASE) (500) BYTE,
        TMAP TMAP_STRUC;
35 1    DCL (X_INC, X_NEXT_SCANLINE, X_END, I_INC, I_LEFT_BOUND, I_RIGHT_BOUND) WORD,
        (HI, LO, MIN, MAX, V) INTEGER,
        (MIN_MAX_STATE, MIXED_TIME_BASE) BYTE;
36 1    DCL TBL1(*) BYTE DATA (1,1,4,4,4);
37 1    DCL TBL2(*) BYTE DATA (2,3,2,3,3);
38 1    DCL (IB, IC, ID, IE, IM, IU, IV) WORD;
39 1    DCL (YA, YB, YC, YD, YE, YM, YU, YP, YQ) INTEGER;
40 1    DCL (SLPB, SLPC, SLPM, SLPU, SLPV, SLPP, SLPQ) INTEGER;
        /* DEFINE THE 24-BIT COUNTERS WHICH ADDRESS THE SCREEN AND INPUT BUFFERS */
41 1    DCL I (3) BYTE,
        IQ WORD AT (@I(1)),
        I_LOW2 WORD AT (@I(0)),
        I_HI1 BYTE AT (@I(2));
42 1    DCL X (3) BYTE,
        XQ WORD AT (@X(1)),
        X_LOW2 WORD AT (@X(0)),
        X_HI1 BYTE AT (@X(2));
```

PL/M-86 COMPILER    4500 SINE INTERPOLATION PROCEDURES        28 OCT 81    PAGE 5

APPENDIX II-continued
SINE INTERPOLATED TRACE GENERATING ROUTINE

```
            $EJECT
43  1       DRAW_LINEAR_REGION: PROCEDURE;
            /* LOOP UNTIL REGION HAS BEEN PAINTED. AS DATA IS NEEDED TO FUEL
            !  THE INTERPOLATOR, GO GET IT. AS SCANLINES ARE CROSSED, DRAW
            !  A MIN OR MAX VALUE WHICH THE INTERPOLATOR HAS DEVELOPED SINCE THE
            !  LAST SCANLINE WAS PAINTED. */
44  2       DO WHILE XQ < X_END;
            /* IF INDEX (REMEMBER, POSSIBLY CREEPING ALONG BY MUCH LESS THAN
            !  1 SAMPLE PER EXECUTION OF THIS LOOP) IS INTO A NEW SAMPLE
            !  INTERVAL, SHIFT CONTEXT, GET NEW SAMPLE, AND CALCULATE NEW
            !  POINT C'S SLOPE, NEW POINT M'S SLOPE AND VALUE. */
45  3       IF IQ >= IC THEN PREPARE_SAMPLE_INTERVAL: DO;
47  4       IB = IC; IC = ID; ID = IE;
50  4       YA = YB; YB = YC; YC = YD; YD = YE;
54  4       IE = IE + 32;
55  4       IF IE <= I_RIGHT_BOUND THEN YE = EVAL(T, IE);
57  4       ELSE YE = XTRPLT (YB, YC, YD);
58  4       SLPB = SLPC;
59  4       SLPC = COMPUTE_SLOPE(YA, YB, YD, YE);
60  4       IM = IB + 16;
61  4       SLPM = SAL(YC - YB, 1) - SAR(SLPB + SLPC, 1);
62  4       YM = YB + SAR(SLPB + SLPM, 2);
63  4       END PREPARE_SAMPLE_INTERVAL;
64  3       IF IQ >= IV THEN PREPARE_HALF_INTERVAL: DO;
66  4       IF IQ < IM THEN PREPARE_FIRST_HALF_INTERVAL: DO;
            /* PREPARE FIRST HALF-SAMPLE INTERVAL -- UNTIL INDEX I GETS HALF-WAY
            !  ACROSS TO INDEX CORRESPONDING TO POINT C, USE POINT B AND ITS SLOPE,
            !  AND MIDPOINT M AND ITS SLOPE, FOR INTERPOLATION COMPUTATIONS. NOTE
            !  THAT Y COORDINATE OF POINT V IS NOT NEEDED. */
68  5       IU = IB; IV = IM;
70  5       YU = YB;
71  5       SLPU = SLPB; SLPV = SLPM;
73  5       END PREPARE_FIRST_HALF_INTERVAL;
74  4       ELSE PREPARE_SECOND_HALF_INTERVAL: DO;
            /* NOW USE MIDPOINT OF SAMPLE INTERVAL AS LEFT SIDE OF HALF-INTERVAL,
            !  AND RIGHT SIDE OF SAMPLE INTERVAL AS RIGHT SIDE OF HALF-INTERVAL. */
75  5       IU = IM; IV = IC;
77  5       YU = YM;
78  5       SLPU = SLPM; SLPV = SLPC;
80  5       END PREPARE_SECOND_HALF_INTERVAL;
```

PL/M-86 COMPILER    4500 SINE INTERPOLATION PROCEDURES          28 OCT 81    PAGE 5 & 6
SINE INTERPOLATED TRACE GENERATING ROUTINE

```
81  4       END PREPARE_HALF_INTERVAL;
            /* NOW WE KNOW WE HAVE INTERPOLATION TECHNIQUE'S NECESSITIES IN
            !  PLACE -- FIGURE OUT SLOPE AND VALUE AT POINT Q. THEN FIND ANY
            !  MINIMA OR MAXIMA BETWEEN PREVIOUS POINT (P) AND POINT Q. */
82  3       SLPQ = SLPU + INT$RATIO(INT(IQ - IU), SLPV - SLPU, 16);
            YQ = YU + INT$RATIO(INT(IQ - IU), SLPU + SLPQ, 64);
84  3       IF SLPP + SLPQ > 0
            THEN DO; LO = YP; HI = YQ; END;
89  3       ELSE DO; LO = YQ; HI = YP; END;
93  3       IF (SLPP > 0) AND (SLPQ < 0)
            THEN HI = YP + SAR(INT$RATIO(SLPP, SLPP, SLPQ - SLPP), 1);
95  3       ELSE IF (SLPP < 0) AND (SLPQ > 0)
            THEN LO = YP + SAR(INT$RATIO(SLPP, SLPP, SLPQ - SLPP), 1);
            /* SAVE Q'S COORDINATES AND SLOPE; THEY WILL BE P'S COORDINATES
            !  AND SLOPE NEXT TIME THROUGH LOOP. */
            YP = YQ; SLPP = SLPQ;
            /* IDENTIFY AND RESPOND TO ANY HIGHER MAXIMA OR LOWER MINIMA THAN
            !  HAD BEEN SEEN SINCE LAST SCANLINE WAS PAINTED. THIS ALGORITHM
            !  IS A STATE-MACHINE, STATE IS CALLED MIN_MAX_STATE -- VALUES
            !  ARE 0 (FLAT), 1 (RISING), 2 (FALLING), 3 (FALLING, BUT FROM A MAXIMUM
            !  HIGHER THAN WHAT WAS LAST PAINTED), AND 4 (RISING, BUT FROM A MINIMUM
            !  LOWER THAN WHAT WAS LAST PAINTED). */
99  3       IF HI > MAX
            THEN DO; MAX = HI;
102 4       MIN_MAX_STATE = TBL1 (MIN_MAX_STATE);
103 4       END;
104 3       ELSE IF LO < MIN
            THEN DO; MIN = LO;
107 4       MIN_MAX_STATE = TBL2 (MIN_MAX_STATE);
108 4       END;
            /* DISPLAY A MAXIMUM OR MINIMUM IF ANOTHER SCANLINE HAS BEEN CROSSED.
            !  MIN_MAX_STATE GUIDES SELECTION OF WHICH TO DISPLAY, AND ALSO
            !  DETERMINES WHAT VALUE OF MIN_MAX_STATE TO CARRY INTO NEXT SCANLINE
            !  INTERVAL. ALSO -- RELEASE CONTROL OF CPU AT THIS POINT. */
            IF XQ >= X_NEXT_SCANLINE THEN DO;
111 4       DO CASE MIN_MAX_STATE;
112 5       DO; V = MAX; MIN = MAX; MIN_MAX_STATE = 0; END;
117 5       DO; V = MAX; MIN = MAX; MIN_MAX_STATE = 0; END;
122 5       DO; V = MIN; MAX = MIN; MIN_MAX_STATE = 0; END;
```

APPENDIX II-continued

| | | |
|---|---|---|
| 127 5 | DO; V = MAX; MAX = MIN; MIN_MAX_STATE = 2; END; | |

PL/M-86 COMPILER    4500 SINE INTERPOLATION PROCEDURES         28 OCT 81    PAGE 6 & 7
SINE INTERPOLATED TRACE GENERATING ROUTINE

| | |
|---|---|
| 132 5 | DO; V = MIN; MIN = MAX; MIN_MAX_STATE = 1; END; |
| 137 5 | END; |
| 138 4 | TRACE_BUFFER (SHR(XQ, 7)) = LOW(UNSIGN(ICLIP(V, −127, +127))); |
| 139 4 | X_NEXT_SCANLINE = X_NEXT_SCANLINE + 128; |
| 140 4 | CALL SUSPEND$TASK; |
| 141 4 | END; |
| | /* ADVANCE, EITHER 1 SCANLINE OR 1 SAMPLE, WHICHEVER IS SMALLER, |
| | ! USING 24-BIT ADDITION. */ |
| 142 3 | I_LOW2 = I_LOW2 + I_INC; I_HI1 = I_HI1 PLUS 0; |
| 144 3 | X_LOW2 = X_LOW2 + X_INC; X_HI1 = X_HI1 PLUS 0; |
| 146 3 | END; |
| 147 2 | END DRAW_LINEAR_REGION; |

PL/M-86 COMPILER    4500 SINE INTERPOLATION PROCEDURES         28 OCT 81    PAGE 8
SINE INTERPOLATED TRACE GENERATING ROUTINE $EJECT

| | |
|---|---|
| 148 1 | INITIALIZE: PROCEDURE; |
| 149 2 | YP, YC = EVAL(T, IC); |
| 150 2 | ID = IC + 32; IF ID <= I_RIGHT_BOUND |
| | THEN YD = EVAL(T, ID); |
| 153 2 | ELSE YD = XTRPLT(EVAL(T, IC - 64), EVAL(T, IC = 32), YC); |
| 154 2 | IE = ID + 32; IF ID <= I_RIGHT_BOUND |
| | THEN YE = EVAL(T, IE); |
| 157 2 | ELSE YE = XTRPLT(EVAL(T, IC - 16), YC, YD); |
| 158 2 | IF IC >= I_LEFT_BOUND + 32 |
| | THEN YB = EVAL(T, IC - 32); |
| 160 2 | ELSE YB = XTRPLT(YE, YD, YC); |
| 161 2 | IF IC >= I_LEFT_BOUND + 64 |
| | THEN YA = EVAL(T, IC - 64); |
| 163 2 | ELSE YA = XTRPLT (YD, YC, YB); |
| 164 2 | SLPP, SLPC = COMPUTE_SLOPE(YA, YB, YD, YE); |
| 165 2 | IV, IQ = IC; |
| 166 2 | I(O) = 0; |
| 167 2 | END INITIALIZE; |

PL/M-86 COMPILER    4500 SINE INTERPOLATION PROCEDURES         28 OCT 81    PAGE 9
SINE INTERPOLATED TRACE GENERATING ROUTINE $EJECT

| | |
|---|---|
| 168 1 | SINE: PROCEDURE(PT, PTRACE_BUFFER_BASE, PTMAP_BASE) PUBLIC; |
| | /* ROUTINE DRAWS TRACE FROM X TO X_LAST, USING SINE INTERPOLATION, |
| | ! IN BOTH EXPANDED AND CONTRACTED CASES. */ |
| 169 2 | DCL PT BYTE, |
| | PTRACE_BUFFER_BASE POINTER, |
| | PTMAP_BASE POINTER; |
| | /* WRITE ALL PARAMETERS TO MODULE-LEVEL VARIABLES, SO SUBROUTINE |
| | ! DRAW_LINEAR_REGION CAN ACCESS THEM, AND TO SIMPLIFY DEBUGGING.*/ |
| 170 2 | T = PT; TRACE_BUFFER_BASE = PTRACE_BUFFER_BASE; |
| 172 2 | CALL MOVW (PTMAP_BASE, @TMAP, 10); |
| | /* TO START ALGORITHM, NEED TO LOAD UP 5 SAMPLES TOTAL. THESE ARE |
| | ! CALLED A, B, C, D, AND E. THEN NEED TO COMPUTE SLOPE AT POINT |
| | ! C. THIS LEADS INTO THE WHILE LOOP IN DRAW_LINEAR_REGION. |
| | ! FIRST TIME IN DATA POINTS AND SLOPES ARE SHIFTED OVER LEFT |
| | ! ONE AND SLOPE AT NEW 'C' IS COMPUTED. ALGORITHM WILL INTERPOLATE |
| | ! AND LOCATE MINIMA AND MAXIMA IN REGION BETWEEN POINTS B AND C. */ |
| 173 2 | IC = TMAP.IL; |
| 174 2 | I_LEFT_BOUND = 0; |
| | /* IF MIXED TIME BASE, FORBID ALGORITHM FROM REACHING PAST TRIGGER POINT |
| | ! IN ITS INTERPOLATNG ZEAL. */ |
| 175 2 | IF TMAP.MTB THEN I_RIGHT_BOUND = TMAP.IM; ELSE I_RIGHT_BOUND = TMAP.ILIMIT; |
| 178 2 | CALL INITIALIZE; |
| 179 2 | MIN, MAX = YC; MIN_MAX_STATE = 0; |
| 181 2 | X_SCANLINE = XQ; |
| | /* NOW DRAW UNTIL PRE-TRIGGER PART HAS BEEN PAINTED. */ |
| 182 2 | X_END = TMAP.XM; X_INC = TMAP.XINC1; I_INC = TMAP.IINC1; |
| 185 2 | CALL DRAW_LINEAR_REGION; |
| | /* PREPARE TO DRAW POST-TRIGGER PART. FIRST, ALLOW ACCESS TO REMAINING |
| | ! SAMPLES. */ |
| 186 2 | I_RIGHT_BOUND = TMAP.ILIMIT; |
| | /* IF THERE IS A DISCONTINUITY AT THE TRIGGER POINT, COMPUTE |
| | ! NEW VALUES FOR YA, YB, YC, YD, YE, SLPC, YP, SLPP, IV, IQ */ |

PL/M-86 COMPILER    4500 SINE INTERPOLATION PROCEDURES         28 OCT 81    PAGE 9 & 10
SINE INTERPOLATED TRACE GENERATING ROUTINE

| | |
|---|---|
| 187 2 | IF TMAP.MTB THEN DO; |
| 189 3 | I_LEFT_BOUND = TMAP.IM; |
| 190 3 | CALL INITIALIZE; |
| 191 3 | END; |
| | /* NOW DRAW UNTIL POST-TRIGGER PART HAS BEEN PAINTED. */ |
| 192 2 | X_END = TMAP.XR; X_INC = TMAP.XINC2; I_INC = TMAP.IINC2; |
| 195 2 | CALL DRAW_LINEAR_REGION; |
| 196 2 | END SINE; |
| 197 1 | END; |

APPENDIX II-continued

MODULE INFORMATION:
CODE AREA SIZE = 04EFH 1263D
CONSTANT AREA SIZE = 020AH 522D
VARIABLE AREA SIZE = 006CH 108D
MAXIMUM STACK SIZE = 0024H 36D
352 LINES READ
0 PROGRAM ERROR(S)
END OF PL/M-86 COMPILATION

I claim:

1. A method of acquiring and displaying information of an analog waveform, comprising the steps of:
   acquiring samples of the magnitude of said waveform at equal time intervals therealong,
   determining the slope of the waveform at each of a plurality of successively acquired samples, the slope at each given sample point being determined from the magnitude of the two samples immediately preceding said given sample point and the magnitude of the two samples immediately following said given sample point,
   determining the slope of the waveform at a point intermediate of each sampling interval, each intermediate slope being determined from the acquired magnitude and calculated slope of the acquired samples at the beginning and end of the sampling interval,
   determining the magnitude of a plurality of points within the sample intervals, the points within a given sample interval being determined from the magnitude of the acquired samples at the beginning and end of the interval, their calculated slope and the calculated intermediate slope, and
   displaying the sample magnitudes and the calculated intermediate magnitudes in a manner to permit observation of a reconstructed waveform.

2. A method according to claim 1 wherein determining the slope of the waveform at each of a plurality of successively acquired samples comprises the step of:
   determining the slope of a line extending between sample points immediately on either side of said given sample point,
   determining the slope of a line extending between sample points on either side of said given sample point and removed one sample therefrom,
   ratioing the two slopes,
   using the value of said ratio as an index to a table, thereby to give a value from said table, and
   multiplying the value from the table by the slope first determined above, thereby to obtain the value of the waveform slope at said given sample point.

3. The method according to either of claims 1 or 2 wherein determining the slope of the waveform at a point intermediate of each sampling interval, comprises the steps of:
   determining the difference in magnitude of the acquired samples at the beginning and end of the interval and multiplying that difference by two, and
   determining the sum of the determined slope of the waveform at the acquired samples at the beginning and end of the interval, dividing such sum by two and subtracting the resulting quantity from that determined from the preceding step.

4. A method of acquiring and displaying an analog waveform, comprising the steps of:
   acquiring samples of the magnitude of said waveform at equal time intervals therealong,
   determining the slope of the waveform at a plurality of such samples, a method of determining each such slope for a given sample point comprising the steps of:
   determining the slope of a line extending between sample points immediately on either side of said given sample point,
   determining the slope of a line extending between sample points on either side of said given sample point and removed one sample therefrom,
   ratioing the two slopes,
   using the value of said ratio as an index to a table, thereby to give a value from said table, and
   multiplying the value from the table by the slope first determined above, thereby to obtain the value of the waveform slope at said given sample point, and
   utilizing said slopes to display information of said analog waveform.

5. A method of acquiring and displaying an analog waveform, comprising the steps of:
   acquiring samples of the magnitude of said waveform at equal time intervals therealong,
   determining the slope of the waveform at each of a plurality of successively acquired samples,
   determining the slope of the waveform at a point intermediate of each sampling interval, each intermediate slope being determined by a method comprising the steps of:
   determining the difference in magnitude of the acquired samples at the beginning and end of the interval and multiplying that difference by two, and
   determining the sum of the calculated slope of the curves at the acquired samples at the beginning and end of the interval, dividing such sum by two and subtracting the resulting quantity from that determined from the preceding step,
   determining the magnitude of a plurality of points within the sample intervals, the points within a given sample interval being determined in part from the magnitude of the determined intermediate slope, and
   displaying the sample magnitudes and the determined intermediate magnitudes in a manner to permit observation of a reconstructed waveform.

6. For an analog waveform wherein samples of its magnitude have been taken at equal time intervals therealong, a method of determining the frequency of said analog waveform at a given sample, comprising the steps of:
   determining the slope of the line extending between sample points immediately on either side of said given sample, determining the slope of the line extending between sample points upon either side of said given sample and removed one sample therefrom, ratioing the two slopes, determining the arc cosine of said ratio, thereby to give the sample interval in radians of the analog waveform, and converting the interval in radians to frequency and indicating said frequency.

7. A system for displaying an accurate replica of an analog waveform, comprising:

means receiving said analog waveform for taking samples of its magnitude at equal time intervals therealong, means receiving said samples for determining the slope of the waveform at each of a plurality of successively acquired samples, means receiving the samples and the determined slopes thereat for estimating the slope at the waveform at a point intermediate of each sampling interval, means receiving the acquired samples, the determined slopes thereat and the estimated intermediate slopes for estimating the magnitude of a plurality of points within each of the sample intervals, and means receiving the acquired samples and the estimated sample points for creating a display of the reconstructed waveform.

8. The system according to claim 7 wherein the slope determining means comprises:

means receiving the magnitude of the acquired samples immediately on either side of said given sample for determining a slope therebetween, means receiving the magnitude of the acquired samples on either side of said given sample but one sample removed therefrom for determining a slope therebetween, and means receiving said determined slopes for determining the slope at said given sample.

* * * * *